(12) United States Patent
Huang et al.

(10) Patent No.: US 6,521,997 B1
(45) Date of Patent: Feb. 18, 2003

(54) CHIP CARRIER FOR ACCOMMODATING PASSIVE COMPONENT

(75) Inventors: Chien-Ping Huang, Hsinchu (TW); Wei-Chen Tseng, Feng Yuan (TW); Yu-Ting Lai, Taichung (TW)

(73) Assignee: Siliconware Precision Industries Co., Ltd., Taiwan (CN)

( * ) Notice: Subject to any disclaimer, the term of this patent is extended or adjusted under 35 U.S.C. 154(b) by 0 days.

(21) Appl. No.: 10/039,268

(22) Filed: Jan. 2, 2002

(30) Foreign Application Priority Data

Dec. 6, 2001 (TW) .......................... 90130251 A

(51) Int. Cl.[7] .............................................. H01L 23/48
(52) U.S. Cl. .................. 257/737; 257/738; 257/779; 257/783; 257/787; 174/52.4; 174/255; 174/258
(58) Field of Search ................................ 174/52.4, 255, 174/258; 257/737, 738, 779, 783, 787

(56) References Cited

U.S. PATENT DOCUMENTS

| 5,311,405 | A | | 5/1994 | Tribbey et al. ............. 361/767 |
|---|---|---|---|---|
| 6,150,193 | A | * | 11/2000 | Glenn ......................... 438/113 |
| 6,177,731 | B1 | * | 1/2001 | Ishida et al. ................. 257/780 |
| 6,228,466 | B1 | * | 5/2001 | Tsukada et al. ............. 428/209 |
| 6,245,594 | B1 | * | 6/2001 | Wu et al. ..................... 438/108 |
| 6,294,840 | B1 | * | 9/2001 | McCormick ................ 257/778 |
| 6,388,335 | B1 | * | 5/2002 | Lam ............................ 257/778 |
| 6,448,644 | B1 | * | 9/2002 | Lin .............................. 257/734 |

* cited by examiner

*Primary Examiner*—Cathy Lam
(74) *Attorney, Agent, or Firm*—Peter F. Corless; Steven M. Jensen; Edwards & Angell, LLP

(57) ABSTRACT

A chip carrier for accommodating a passive component is proposed, allowing at least a chip to be electrically connected to the chip carrier. At least a pair of spaced-apart solder pads are formed on the chip carrier in no interference with the electrical connection between the chip and the chip carrier. A passive component is bonded at its two ends onto the solder pads by solder paste that electrically connects the passive component to the chip carrier. A recessed portion formed between the pair of the solder pads, is associated with a bottom surface of the passive component to form a passage, allowing a resin material for encapsulating the passive component or the chip to pass through and fill the passage, whereby the filled passage can prevent bridging of the solder paste and short circuit of the passive component from occurrence, thereby making yield of fabricated products desirably improved.

9 Claims, 2 Drawing Sheets

CHIP CARRIER FOR ACCOMMODATING PASSIVE COMPONENT

FIELD OF THE INVENTION

The present invention relates to chip carriers, and more particularly, to a chip carrier for accommodating chips and passive components that are electrically connected to the chip carrier.

BACKGROUND OF THE INVENTION

In accomplishment with desirable electricity and functionality, it tends to incorporate passive components such as capacitor, resistor, or inductor in a semiconductor package.

FIG. 5A illustrates bonding between a passive component and solder pads on a substrate. The substrate 70 is formed at predetermined positions with a pair of solder pads 71 that are properly spaced apart and respectively exposed to outside of a solder mask layer 72 covering the substrate 70. After a proper amount of solder paste 73 is applied on the solder pads 71, it is ready to adhere two ends 740 of a passive component 74 to the solder paste 73. Then, a reflow soldering process is performed for allowing the passive component 74 to be electrically connected to the solder pads 71 by the solder paste 73.

However, the applied amount of solder paste 73 and height of the solder paste 73 after being reflow soldered are difficult to be precisely controlled, and the solder mask layer 72 is hardly achieved with perfect surface flatness; when the solder mask layer 72 is made uneven, the passive component 74 mounted on the soldered solder paste 73 cannot closely abut against the solder mask layer 72, with a gap 75, mostly 10 to 30 μm in height, being undesirably left between the passive component 74 and the solder mask layer 72. Such a gap 75 is dimensionally smaller than fillers contained in an encapsulating resin used for forming an encapsulant 76 that encapsulates the passive component 74. Therefore, during a molding process, the encapsulating resin is not permeable to fill the tiny gap 75, making the passive component 74 undesirably spaced with the solder mask layer 72 by the gap 75, after the encapsulant 76 is formed by molding. In subsequent processes such as solder ball implantation or surface mounting processing, the solder paste 73 is softened under a high temperature condition, and the softened solder paste 73 on the two solder pads 71 may bridge with each other through the gap 75 by virtue of capillary effect, as shown in FIG. 5B. Once the solder paste 73 is bridged, it results in short circuit of the passive component 74, and thus undesirably deteriorates the quality and yield of fabricated products.

U.S. Pat. No. 5,311,405 entitled "Method and Apparatus for Aligning and Attaching a Surface Mount Component", discloses a method for positionally aligning a passive component mounted on a substrate; however, problems caused by the existence of a gap formed between the passive component and the substrate, still cannot be solved.

In another semiconductor package with a passive component being mounted on a substrate, the passive component is not enclosed by an encapsulant used for chip encapsulation, but an electrically-insulative resin is applied for entirely coating the passive component prior to wire bonding and molding processes. Since the passive component on the substrate interferes in position with gold wires used for electrically connecting a chip to the substrate, it is necessary to pre-encapsulate the passive component before forming the gold wires, so as to prevent the gold wires from coming into contact with the naked passive component due to component shifting or wire sagging in subsequent processes. If the gold wires occur to touch the naked passive component, short circuit is induced. Therefore, with the passive component being enclosed by the insulative resin, even if the gold wires are sagged in position, the insulative resin protects the passive component from being in direct contact with the gold wires, so that short circuit can be prevented from occurrence. However, this conventional semiconductor package is still defective for incapable of effectively filling a gap between the passive component and the substrate with the insulative resin, thereby easily causing the passive component being short-circuited due to bridging of solder paste used for attaching the passive component onto the substrate, as mentioned above.

SUMMARY OF THE INVENTION

A primary objective of the present invention is to provide a chip carrier for accommodating a passive component, which can effectively prevent the occurrence of short circuit between the passive component and solder pads.

In accordance with the above and other objectives, the present invention proposes a chip carrier for accommodating a passive component, comprising: a core layer defined with a chip attach area for mounting at least a chip thereon, and a trace forming area surrounding the chip attach area, for forming a plurality of conductive traces on the trace forming area; a solder mask layer applied onto the trace forming area; and at least a pair of spaced-apart solder pads formed on the trace forming area and partly exposed to outside of the solder mask layer, wherein a recessed portion is formed at the solder mask layer between the pair of the solder pads, allowing a bottom surface of a passive component that is bonded by solder paste to the solder pads, to form a passage in association with the recessed portion, and the passage is sufficiently dimensioned for allowing a resin material used in encapsulation of the passive component to pass through the passage.

The recessed portion of the solder mask layer can be made as rectangular, circular or elliptic shape without being particularly limited, and is preferably dimensioned not to interfere with routing of the conductive traces.

BRIEF DESCRIPTION OF TIE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

First Preferred Embodiment

Figure 1:
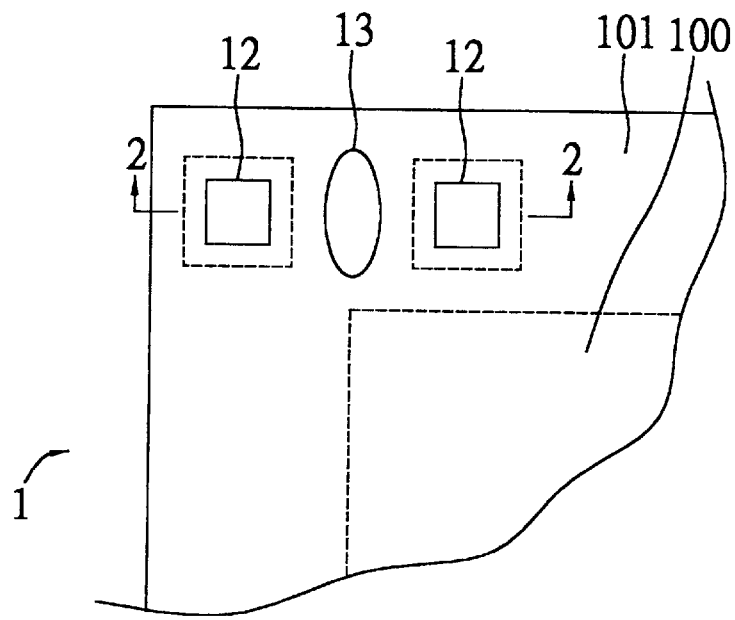
FIG. 1 is a top view of a chip carrier of a first preferred embodiment of the invention.
Figure 2:
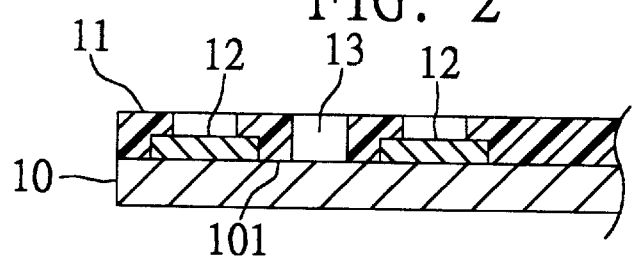
FIG. 2 is a cross-sectional view of FIG. 1 cutting along a line 2—2.

Referring to FIGS. 1 and 2, a chip carrier 1 of a first preferred embodiment of the present invention includes a core layer 10, which core layer 10 is defined with a chip attach area 100 for mounting at least a chip (not shown) thereon, and a trace forming area 101 surrounding the chip attach area 100, allowing a plurality of conductive traces (not shown) to be formed on the trace forming area 101. The trace forming area 101 is applied with a solder mask layer 11 for covering the conductive traces on the trace forming area 101. And, the trace forming area 101 is further formed with at least a pair of spaced-apart solder pads 12 thereon, allowing a passive component to be bonded onto the solder pads 12 (described in detail thereinafter).

The solder pads 12 can be made of a metallic material such as copper, and are partly exposed to outside of the solder mask layer 11. Further, a recessed portion 13 is formed at the solder mask layer 11 between the pair of the solder pads 12, and preferably dimensioned not to interfere with routing of the conductive traces. Besides elliptic shape illustrated in FIG. 1, the recessed portion 13 can also be made as circular, rectangular or any suitable shape without being particularly limited.

The core layer 10 can be conventionally made of a material such as glass fiber, epoxy resin, polyimide tape, FR4 resin, BT (bismaleimide triazine) resin, or the like.

Figure 3:
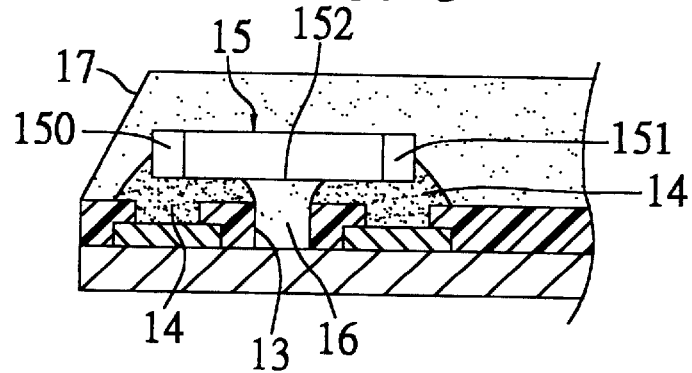
FIG. 3 is a partial cross-sectional view of a chip carrier mounted with a chip and a passive component and encapsulated by an encapsulant in a first preferred embodiment of the invention.

As shown in FIG. 3, solder paste 14 is applied on the solder pads 12, allowing two ends 150, 151 of a passive component 15 to be respectively attached onto the solder pads 12 by the solder paste 14. Then, a conventional reflow soldering process is performed, so as to bond and electrically connect the passive component 15 to the solder pads 12 by means of the solder paste 14. With the passive component 15 being mounted on the solder pads 12, a passage 16 is formed by a bottom surface 152 of the passive component 15 in association with the recessed portion 13. In a subsequent molding process, an encapsulating resin is adopted for forming an encapsulant 17 that encapsulates the chip (not shown) and the passive component 15, and allowed to pass through the sufficiently dimensioned passage 16; that is, the passage 16 is necessarily made to be larger in height than the size of fillers contained in the encapsulating resin, thereby making the encapsulating resin able to smoothly flow through the passage 16 between the passive component 15 and the recessed portion 13. Therefore, after molding, the passage 16 can be entirely filled with the encapsulating resin. During subsequent solder ball implantation or surface mounting processing, the thermally-softened solder paste 14 on the solder pads 12 can be completely blocked from each other by the resin-filled passage 16, without resulting in bridging of the solder paste 14, and thus short circuit of the passive component 15 can be prevented from occurrence. In addition, since the recessed portion 13 is positioned between the pair of the solder pads 12, it does not occupy additional surface area of the chip carrier 1, and does not undesirably affect routing of the conductive traces on the chip carrier 1. Moreover, the recessed portion 13 can be simultaneously formed in accompany with the procedure for exposing the solder pads 12 to outside of the solder mask layer 11, thereby not undesirably increasing the complexity in fabrication. And, the solder pads 12 are made by using conventional equipment and processes, therefore without generating any increase in fabrication costs.

Second Preferred Embodiment

Figure 4:
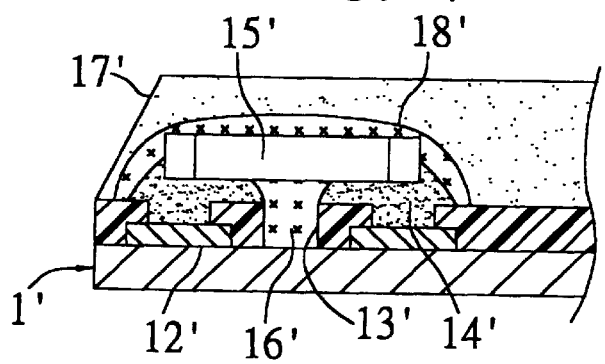
FIG. 4 is a cross-sectional view of a chip carrier mounted with a passive component and encapsulated by an encapsulant in a second preferred embodiment of the invention.
Figure 5A:
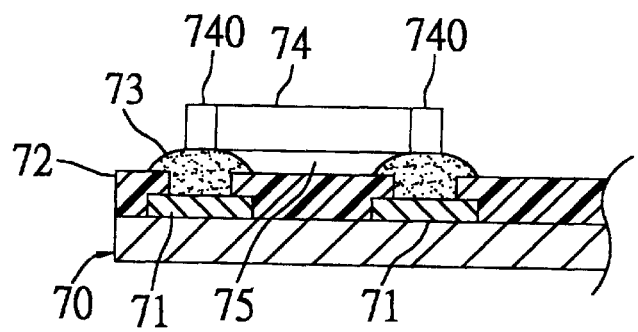
FIG. 5A (PRIOR ART) is a cross-sectional view of a substrate with a passive component being bonded to solder pads on the substrate.
Figure 5B:
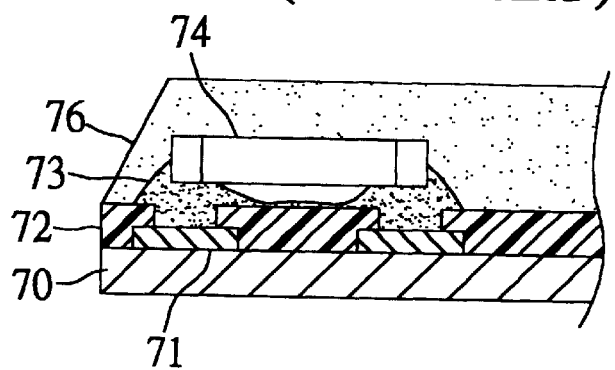
FIG. 5B (PRIOR ART) is a schematic diagram showing bridging of solder paste during a reflow soldering process of FIG. 5A.

FIG. 4 illustrates a chip carrier mounted with a passive component and encapsulated by an encapsulant in a second preferred embodiment of the invention. This chip carrier 1' of the second embodiment is structurally identical to that of the first embodiment, as both are a substrate for use in a BGA (ball grid array) semiconductor package. The only difference in this embodiment is that, after a passive component 15' is bonded to solder pads 12' on the chip carrier 1', a conventional electrically-insulative resin 18' such as epoxy resin is applied for coating the passive component 15' so as to entirely encapsulate the passive component 15'. A recessed portion 13' formed between the solder pads 12' and sided by a bottom surface of the passive component 15' to form a passage 16', is sufficiently dimensioned for allowing the insulative resin 18' to pass through and fill the passage 16'. After the insulative resin 18' is cured, the passage 16' completely filled with the insulative resin 18', can effectively prevent the bridging effect of solder paste 14' that is used for attaching the passive component 15' onto the solder pads 12', whereby the passive component 15' is assured without being short-circuited. Finally, in a subsequent process, an encapsulant 17' is formed to encapsulate the insulative resin 18'; since this process is conventionally well known, it is not further described herein.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A chip carrier for accommodating a passive component, comprising:

a core layer having a chip attach area, and a trace forming area surrounding the chip attach area, for forming a plurality of conductive traces on the trace forming area;

a solder mask layer applied onto the trace forming area; and at least a pair of spaced-apart solder pads formed on the trace forming area, for bonding the passive component onto the solder pads, wherein the solder pads are partly exposed to outside of the solder mask layer, and a recessed portion is formed at the solder mask layer between the pair of the solder pads.

2. The chip carrier of claim 1, wherein the recessed portion is associated with a bottom surface of the passive component to form a passage, allowing an encapsulating resin used in a molding process to pass through and fill the passage, whereby bridging of solder paste that is used for bonding the passive component onto the solder pads, and short circuit of the passive component, are prevented from occurrence by virtue of the filled passage.

3. The chip carrier of claim 1, wherein the passive component is coated by an electrically-insulative resin, and the electrically-insulative resin fills a passage formed by the recessed portion and a bottom surface of the passive component, whereby bridging of solder paste that is used for bonding the passive component onto the solder pads, and short circuit of the passive component, are prevented from occurrence by virtue of the filled passage.

4. The chip carrier of claim 3, wherein the passive component coated with the electrically-insulative resin is further encapsulated by an encapsulating resin.

5. The chip carrier of claim 1, wherein the recessed portion is made as a rectangular shape.

6. The chip carrier of claim 1, wherein the recessed portion is made as a circular shape.

7. The chip carrier of claim 1, wherein the recessed portion is made as an elliptic shape.

8. The chip carrier of claim 1, wherein the core layer is made of a material selected from a group consisting of glass fiber, epoxy resin, polyimide tape, FR4 resin and BT (bismaleimide triazine) resin.

9. The chip carrier of claim 1, wherein the pair of the solder pads are formed on the trace forming area at positions free of interference with routing of the conductive traces.

* * * * *